US011547007B2

(12) United States Patent
Chen et al.

(10) Patent No.: US 11,547,007 B2
(45) Date of Patent: Jan. 3, 2023

(54) FIXING MECHANISM FOR ELECTRONIC DEVICE

(71) Applicant: ASUSTEK COMPUTER INC., Taipei (TW)

(72) Inventors: Cheng-Wei Chen, Taipei (TW); Kang-Yu Lai, Taipei (TW); Hsiu-Chieh Chu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/366,572

(22) Filed: Jul. 2, 2021

(65) Prior Publication Data

US 2022/0030728 A1    Jan. 27, 2022

(30) Foreign Application Priority Data

Jul. 23, 2020   (TW) .................................. 109124868

(51) Int. Cl.
*H05K 5/02*          (2006.01)
(52) U.S. Cl.
CPC ................... *H05K 5/0221* (2013.01)

(58) Field of Classification Search
CPC ...... H05K 5/0221; G11B 33/124; G06F 1/187
See application file for complete search history.

(56) References Cited

U.S. PATENT DOCUMENTS

2007/0267951 A1   11/2007  Lin
2009/0091882 A1   4/2009   Liu et al.

*Primary Examiner* — James Wu
*Assistant Examiner* — Hung Q Dang
(74) *Attorney, Agent, or Firm* — Muncy, Geissler, Olds & Lowe, P.C.

(57) ABSTRACT

A fixing mechanism, applied to an electronic device to fix an electronic module. The fixing mechanism comprises a casing, a fixing structure and a locking structure. The casing includes a baseplate and a side plate to define a space to accommodate the electronic module, and the side plate has a hole and a seat. The fixing structure includes a fixing element and a pressing portion. The fixing element movably extends from the outer side of the side plate into the space through the hole. The pressing portion is rotatably disposed on the combining seat, and includes a first part having an opening and a second part corresponding to the fixing element. The locking structure is movably set in the opening, and includes an engaging element. When the engaging element is engaged in the opening, the locking structure presses against the side plate to fix the pressing portion.

9 Claims, 12 Drawing Sheets

FIXING MECHANISM FOR ELECTRONIC DEVICE

CROSS-REFERENCE TO RELATED APPLICATION

This application claims the priority benefit of Taiwan application serial No. 109124868, filed on Jul. 23, 2020. The entirety of the above-mentioned patent application is hereby incorporated by reference herein and made a part of specification.

BACKGROUND OF THE INVENTION

Field of the Invention

The invention relates to a fixing mechanism, particularly to a fixing mechanism for electronic devices.

Description of the Related Art

Hard disks are usually configured in the computer for users to store data. Traditional computers mostly fix the hard disks by screws or trays with grooves. However, in the way of screw locking, users need to use tools, and the operation is complicated. In the way of trays with grooves, it occupies larger space, and the cost of components is higher.

BRIEF SUMMARY OF THE INVENTION

A fixing mechanism is provided. The fixing mechanism is applied to an electronic device to fix an electronic module. The fixing mechanism comprises a casing, a fixing structure and a locking structure. The casing includes a baseplate and a side plate to define a space to accommodate the electronic module. And the side plate includes a hole and a seat.

The fixing structure includes a fixing element and a pressing portion. The fixing element movably extends from the outer side of the side plate into the space through the hole. The pressing portion is rotatably disposed on the seat, and includes a first part and a second part. The first part includes an opening, and the second part corresponds to the fixing element.

The locking structure is movably set in the opening, and includes an engaging element. When the engaging element is engaged in the opening, the locking structure passes through the opening and presses against the side plate to fix the pressing portion.

The fixing mechanism provided allows users to quickly disassemble and assemble the electronic module more conveniently, and firmly fixes the electronic module.

DETAILED DESCRIPTION OF THE EMBODIMENTS

Specific embodiments of the disclosure will be described in further detail below with reference to schematic drawings. The advantages and features of the disclosure will become more apparent from the following description and claims. It is to be noted that the drawings are all in a very simplified form and are not drawn to accurate scale, but are merely used for convenience and clarity of description of the embodiments of the disclosure.

Figure 1A:
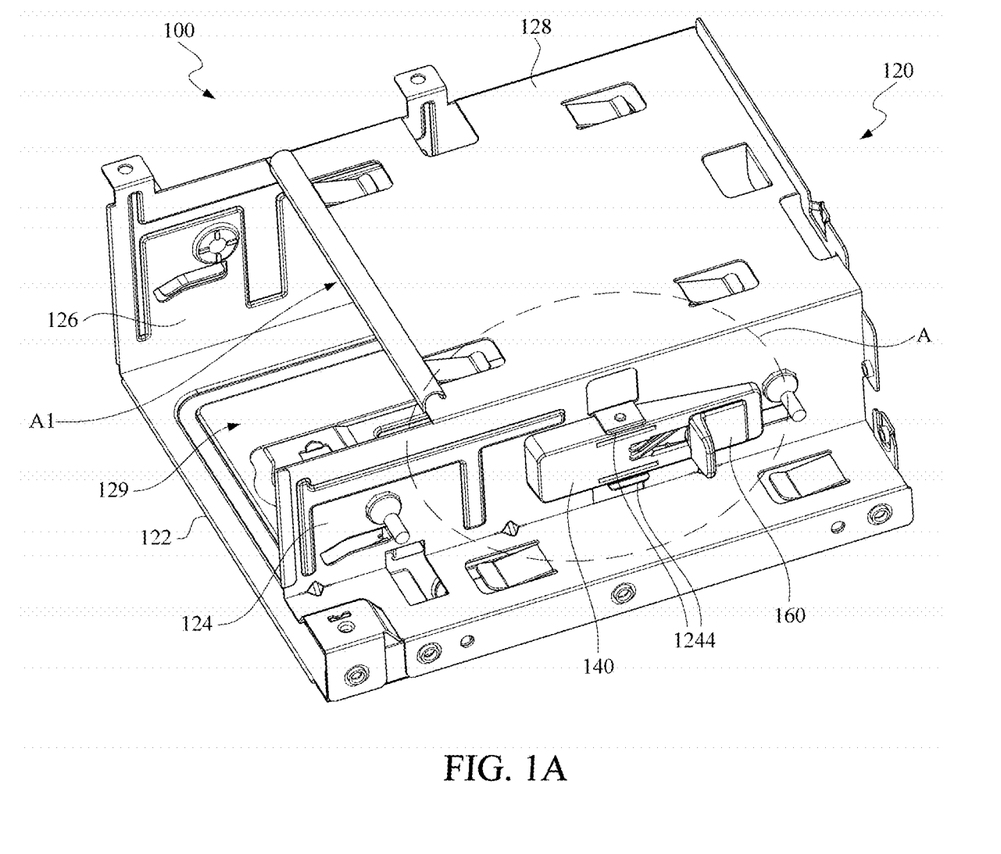
FIG. 1A is a three-dimensional diagram of a fixing mechanism in an embodiment.
Figure 1B:
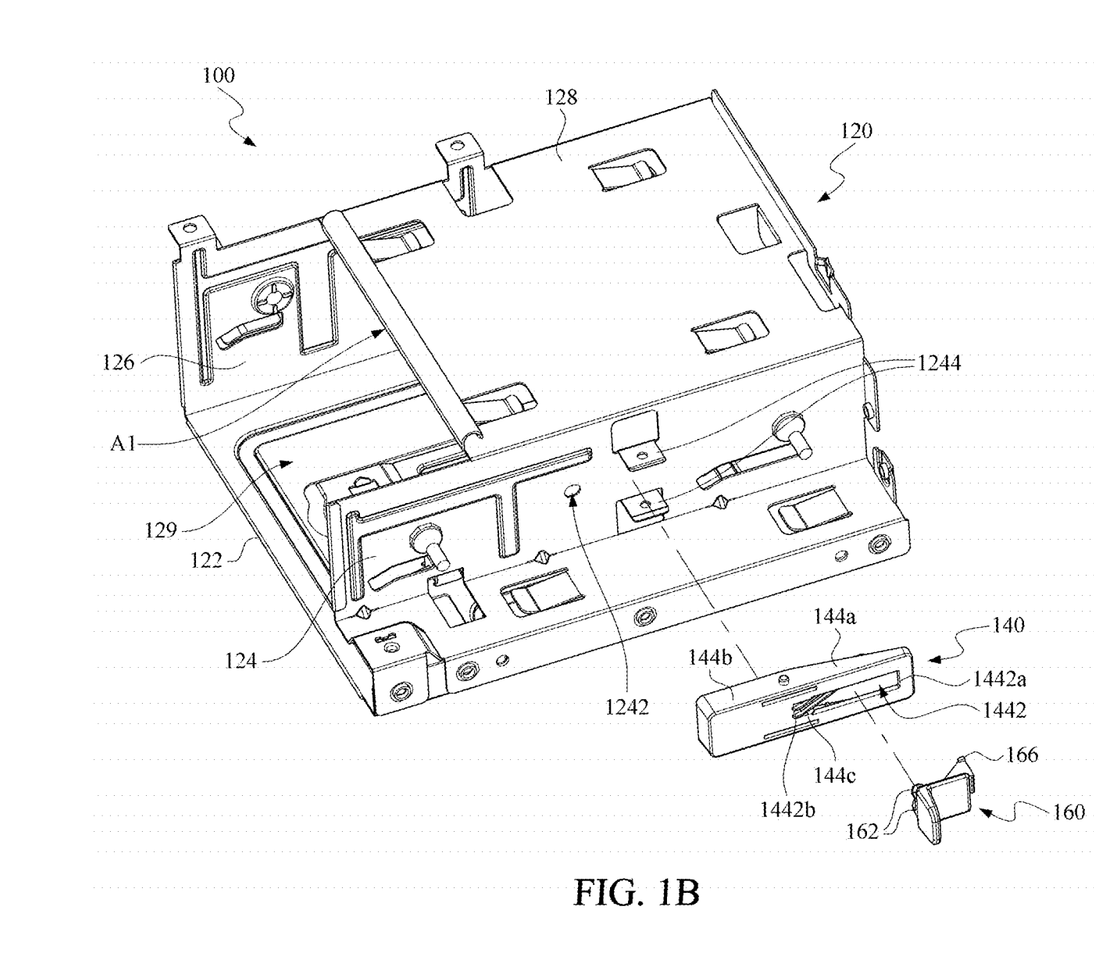
FIG. 1B is an explosion diagram of the fixing mechanism in FIG. 1A.

FIG. 1A is a three-dimensional diagram of a fixing mechanism in an embodiment. FIG. 1B is an explosion diagram of the fixing mechanism in FIG. 1A. The fixing mechanism 100 is applied to an electronic device (not shown) to fix an electronic module. In an embodiment, the electronic module is a hard disk, an optical drive or an expansion device, which is not limited herein. In an embodiment, the electronic device is a desktop computer, a server or a notebook computer, which is not limited herein.

As shown, the fixing mechanism 100 includes a casing 120, a fixing structure 140 and a locking structure 160. The casing 120 includes a baseplate 122, an upper plate 128 and two side plates 124, 126 that located on the opposite sides of the baseplate 122 define a space A1 for accommodating the electronic modules.

The space A1 includes an installing port 129. The electronic module is installed in the space A1 through the installing port 129. The side plate 124 includes a hole 1242 and a seat 1244. The fixing structure 140 is rotatably disposed on the seat 1244. The locking structure 160 is movably set in the fixing structure 140.

Figure 2A:
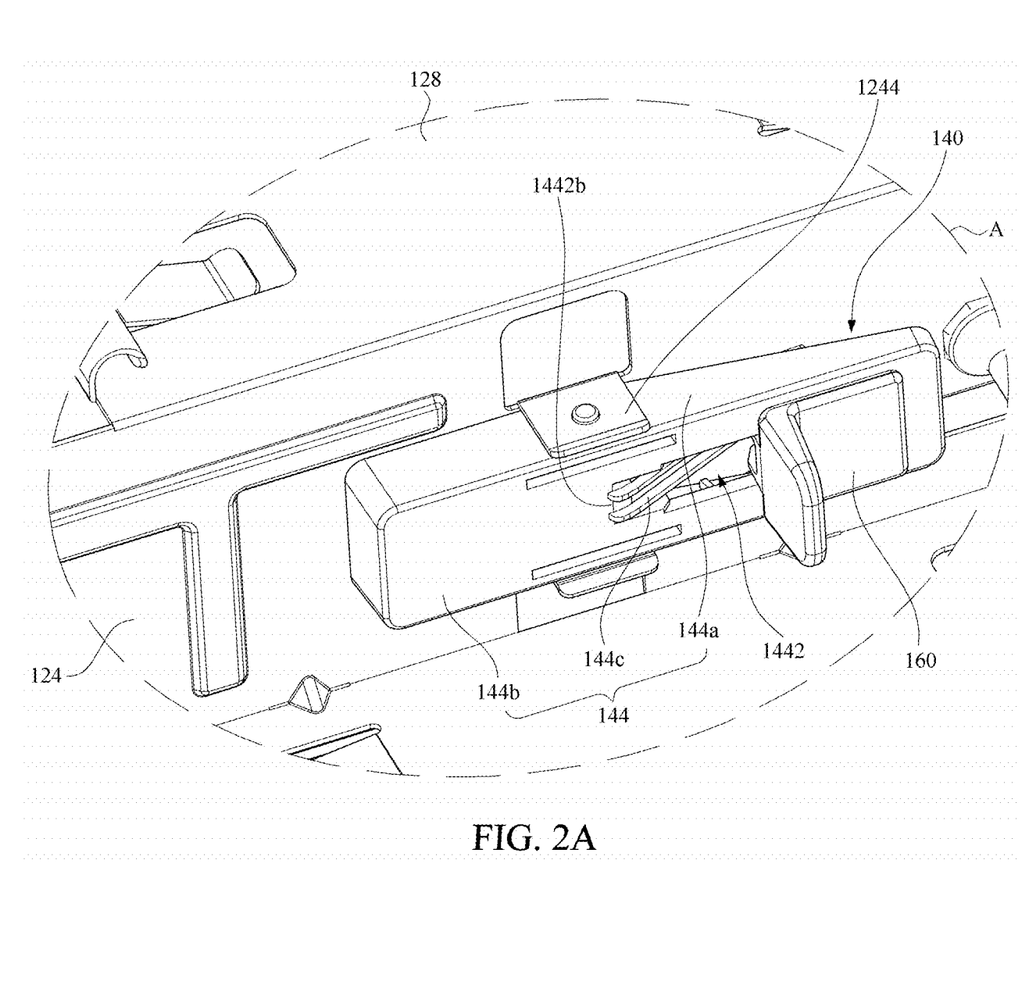
FIG. 2A is an enlarged diagram of a fixing structure and a locking structure of the FIG. 1A.
Figure 2B:
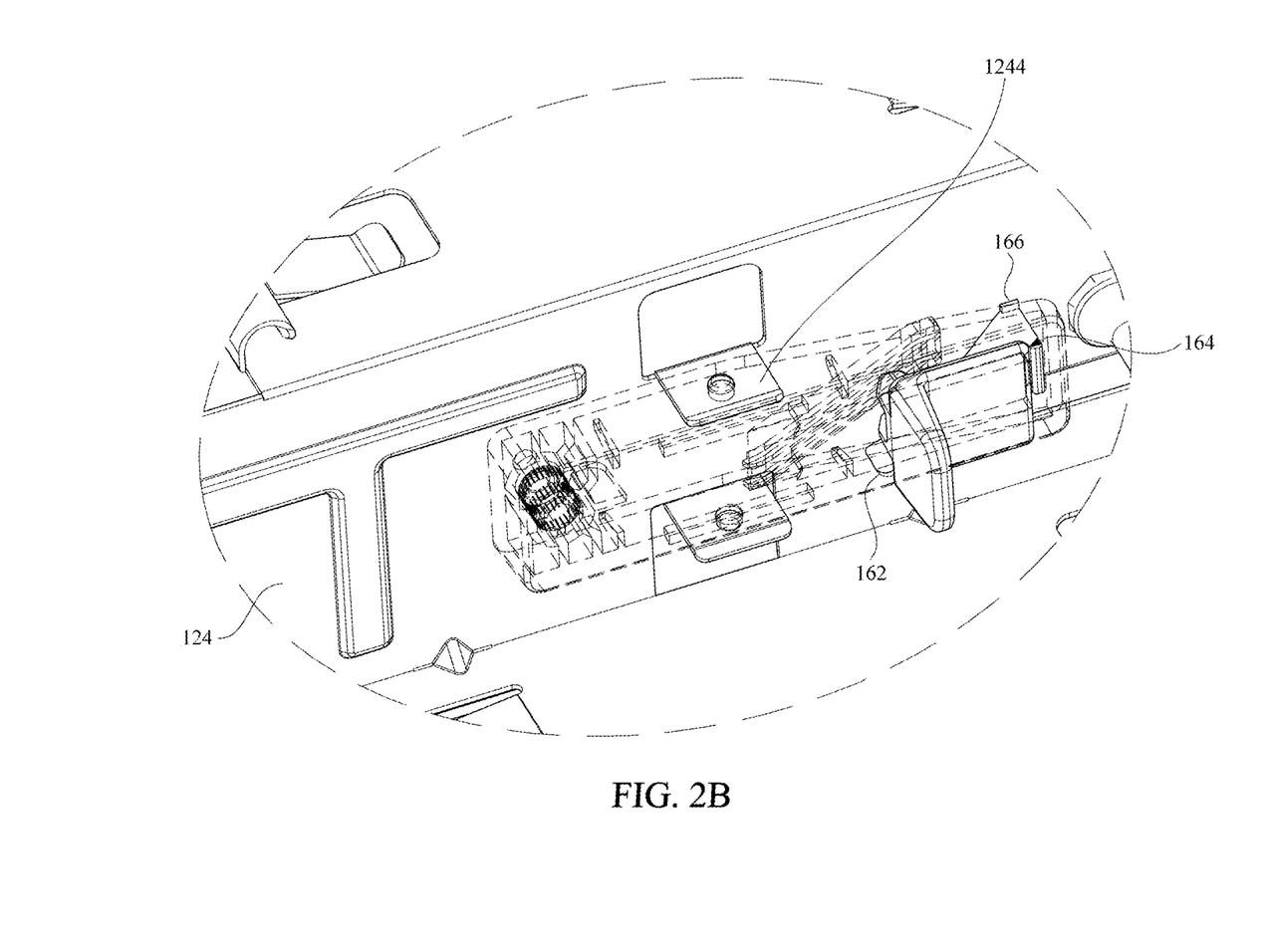
FIG. 2B is a perspective diagram of the fixing structure in FIG. 2A to show the positional relationship between the locking structure, the fixing structure and a casing.
Figure 3:
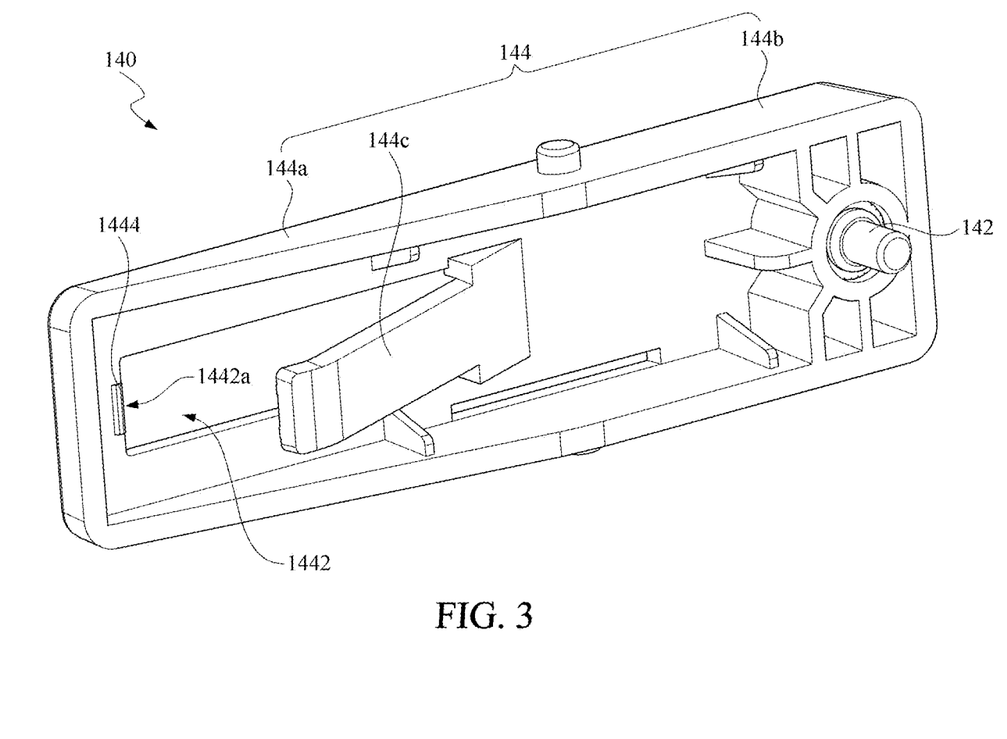
FIG. 3 is a three-dimensional schematic diagram of the fixing structure from another perspective.

Please refer to FIG. 2A, FIG. 2B and FIG. 3. FIG. 2A is an enlarged diagram of the fixing structure 140 and the locking structure 160 of FIG. 1A. FIG. 2B is a perspective diagram of the fixing structure 140 in FIG. 2A to show the positional relationship between the locking structure 160, the fixing structure 140 and the casing 120. And FIG. 3 is a three-dimensional schematic diagram of the fixing structure 140 from another perspective.

As shown, the fixing structure 140 includes a fixing element 142 and a pressing portion 144. The fixing element 142 is movably installed in the hole 1242, which extends from the outside of the side plate 124 to the space A1 through the hole 1242 to fix the electronic module.

In an embodiment, the fixing element 142 is cylindrical shaped, which is not limited herein. In other embodiments, the fixing element 142 is columnar or other irregular shapes.

The pressing portion 144 is rotatably disposed on the seat 1244, and includes a first part 144a and a second part 144b. The first part 144a and the second part 144b are located on the opposite sides of the seat 1244. The first part 144a includes an opening 1442, and the second part 144b is configured to drive the fixing element 142. In an embodiment, the fixing element 142 connects to the second part 144b of the pressing portion 144, and moves within the hole 1242 with the rotation of the pressing portion 144, which is not limited herein.

In an embodiment, as shown, the pressing portion 144 further includes an elastic plate 144c, which is disposed between the first part 144a and the side plate 124 of the casing 120. The elastic restoring force of the elastic plate 144c makes the second part 144b of the pressing portion 144 drive the fixing element 142 to protrude toward the space A1 to fix the electronic module 200.

In one embodiment, as shown, the opening 1442 is elongated and includes a first edge 1442a and a second edge 1442b opposite to each other. In an embodiment, the elastic plate 144c extends diagonally from the second edge 1442b of the opening 1442 to the side plate 124 to press against the side plate 124, which is not limited herein. The elastic plate 144c connects to other edges of the opening 1442, or connects to the upper and lower surfaces of the pressing portion 144 in other embodiments.

In one embodiment, the first part 144a, the second part 144b and the elastic plate 144c of the pressing portion 144 are integrally formed to reduce manufacturing costs, which is not limited herein.

In one embodiment, the elastic plate 144c is disposed on the side plate 124 of the casing 120, and props up the first portion 144a of the pressing portion 144 outward, so that the second part 144b of the pressing portion 144 drives the fixing element 142 to protrude toward the space A1 to fix the electronic module 200.

Figure 4:
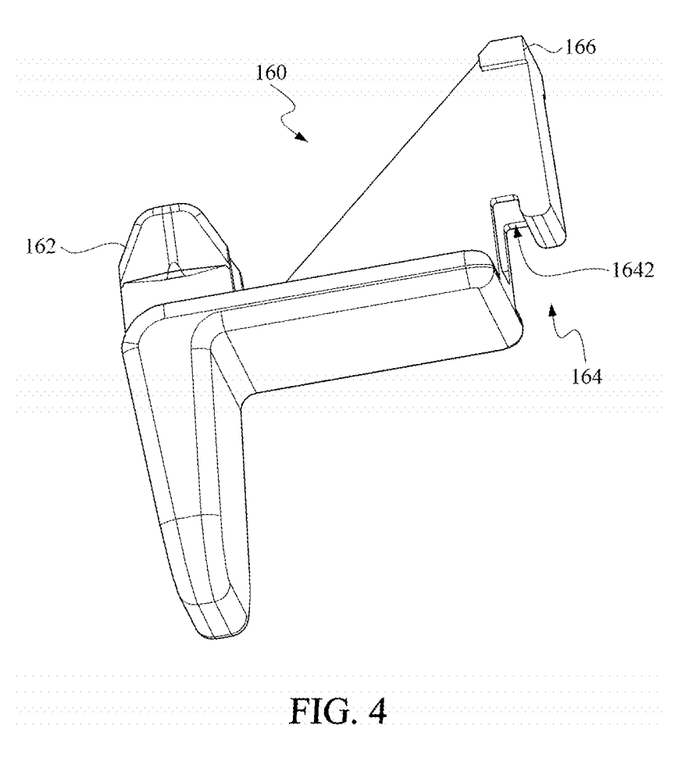
FIG. 4 is a three-dimensional schematic diagram of the locking structure from another perspective.

Please refer to FIG. 2A, FIG. 2B, FIG. 3 and FIG. 4. FIG. 4 is a perspective view of the locking structure 160. As the figures shown, the locking structure 160 is movably disposed on the opening 1442, and includes an engaging element 162 and a locking element 164. The engaging element 162 is configured to engage the locking structure 160 in the opening 1442, and the locking element 164 is configured to engage the locking structure 160 to a first edge 1442a of the opening 1442.

When the engaging element 162 is engaged into the opening 1442 and the locking element 164 is locked to the first edge 1442a of the opening 1442, the locking structure 160 passes through the opening 1442 against the side plate 124 to restrict the pressing portion 144 from rotating, so as to prevent the first part 144a of the pressing portion 144 from moving toward the side plate 124 and loosening the fixing element 142. In this way, it is ensured that the fixing element 142 of the fixing structure 140 is firmly fixed to the electronic module 200.

In one embodiment, as shown, the engaging element 162 is a pair of buckles for propping up the opposite sides of the opening 1442, so that the locking structure 160 is locked in the opening 1442.

In one embodiment, the locking element 164 includes a gap 1642. The first part 144a of the pressing portion 144 includes a protrusion 1444. The protrusion 1444 is located at the first edge 1442a of the opening 1442 and is configured to engage with the locking element 164, so that the locking structure 160 is fixed to the first edge 1442a of the opening 1442, thereby restricting the rotation of the pressing portion 144, which is not limited herein. In other embodiments, the gap 1642 is configured to directly engage with the first edge or other edges of the opening 1442, or other types of the locking element, such as a hook, to detachably fix the locking structure 160 to the opening 1442.

In an embodiment, as shown, the locking structure 160 includes a propping element 166. When the engaging element 162 and the locking element 164 of the locking structure are engaged in the opening 1442, the propping element 166 props up the side plate 124 to fix the pressing portion 144, restricting the first part 144a of the pressing portion 144 from turning toward the side plate 124.

In an embodiment, as shown, the width of the propping element 166 is greater than the width of the opening 1442, to improve the structural stability between the locking structure 160 and the side plate 124, and prevents the locking structure 160 to detach from the opening 1442 of the fixing structure 140. Furthermore, in an embodiment, as shown, the propping element 166 is in a shape of a wing to increase the contact area between the propping element 166 and the side plate 124, and improve the structural stability, which is not limited herein. In other embodiments, the propping element 166 also presents to be other shapes, such as a disc shape or a plate shape.

Figure 5A:
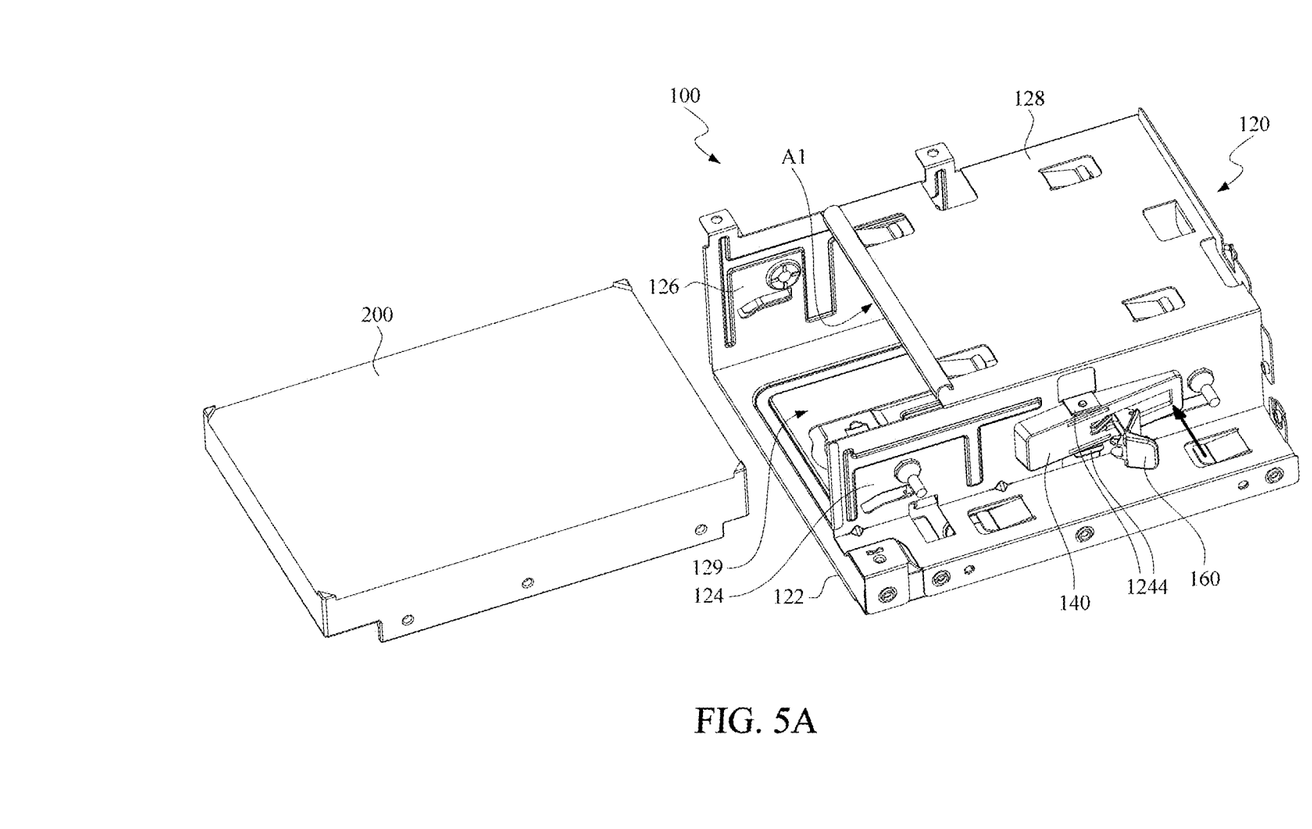
FIG. 5A to FIG. 5C show an embodiment of an installation process of an electronic module using the fixing mechanism of FIG. 1A.
Figure 5B:
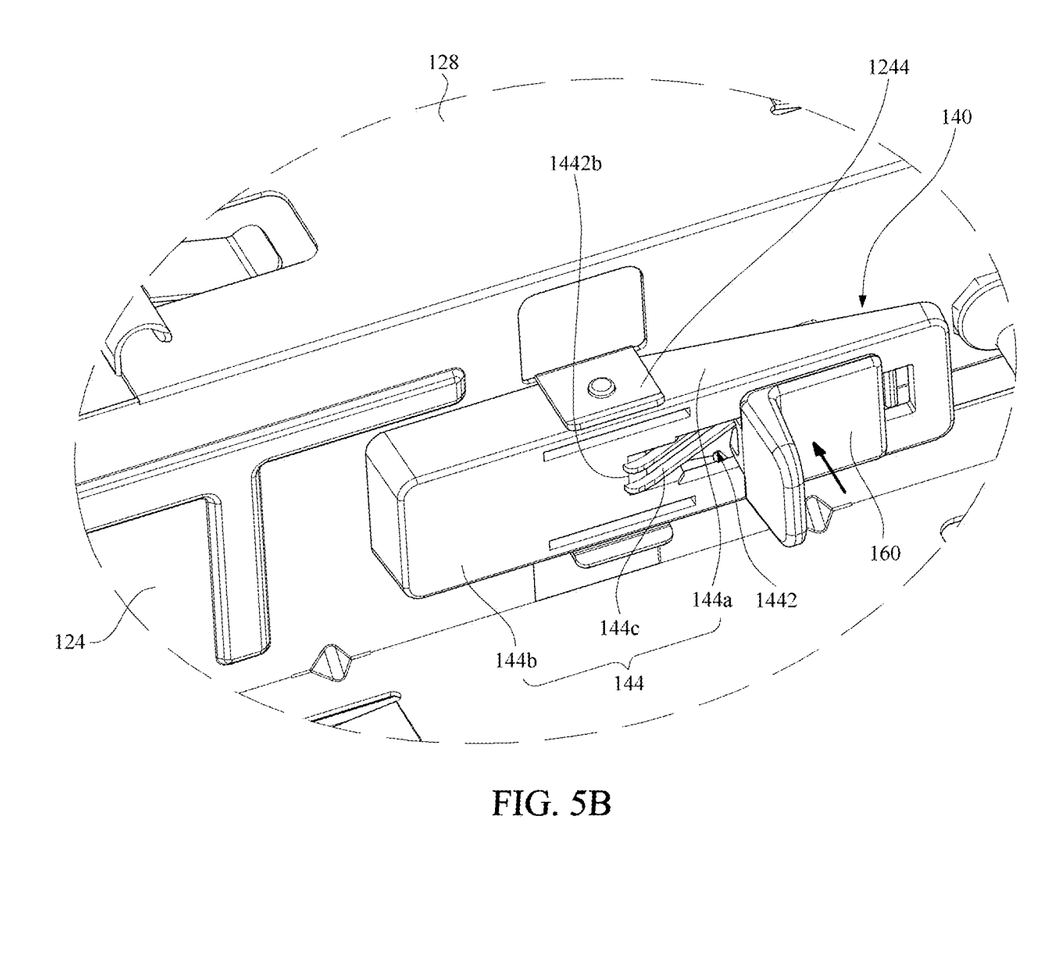
Figure 5C:
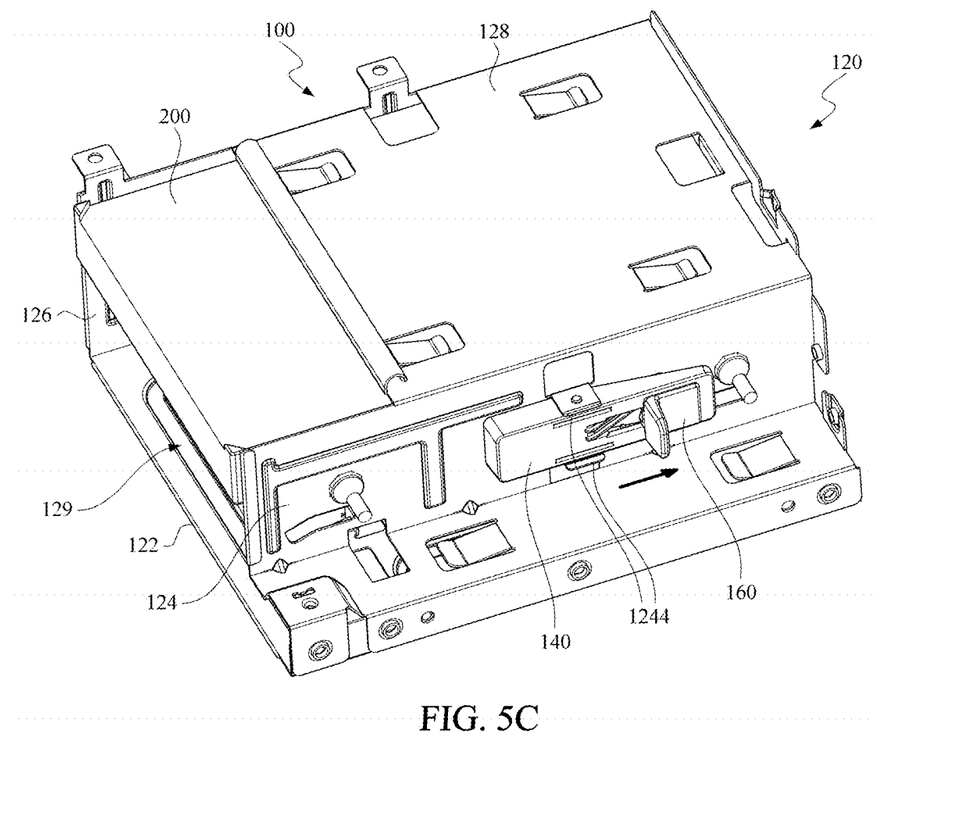

FIG. 5A to FIG. 5C show an embodiment of an installation process of the electronic module using the fixing mechanism 100 of the FIG. 1A.

First, please refer to FIG. 5A, the user presses the first part 144a of the pressing portion 144 (indicated by the arrow shown in the figures), and the fixing element 142 exits the space A1 and moves toward the outside of the side plate 124. With the fixing element 142 in the exit state, the user inserts the electronic module 200 into the space A1 of the casing 120 from the installing port 129.

Next, please refer to FIG. 5B, the user releases the pressing portion 144 after the electronic module 200 is inserted and positioned. At this time, the pressing portion 144 drives the fixing element 142 to protrude toward the space A1 to fix the electronic module 200. Subsequently, the user presses the locking structure 160 (indicated by the arrow shown in the figure), so that the engaging element 162 of the locking structure 160 is engaged in the opening 1442 of the pressing portion 144, to fix the fixing structure 140 in the first stage.

Please refer to the FIG. 5C, the user further moves the locking structure 160 engaged in the opening 1442 toward the first edge 1442a of the opening 1442 (indicated by the arrow shown in the figure), so that the locking element 164 of the locking structure 160 is engaged in the first edge 1442a of the opening 1442 to fix the fixing structure 140 in the second stage. In this way, the pressing portion 144 is prevented from rotating, and the fixing element 142 is prevented from loosening and causing the electronic module 200 to fall and damage.

Figure 6A:
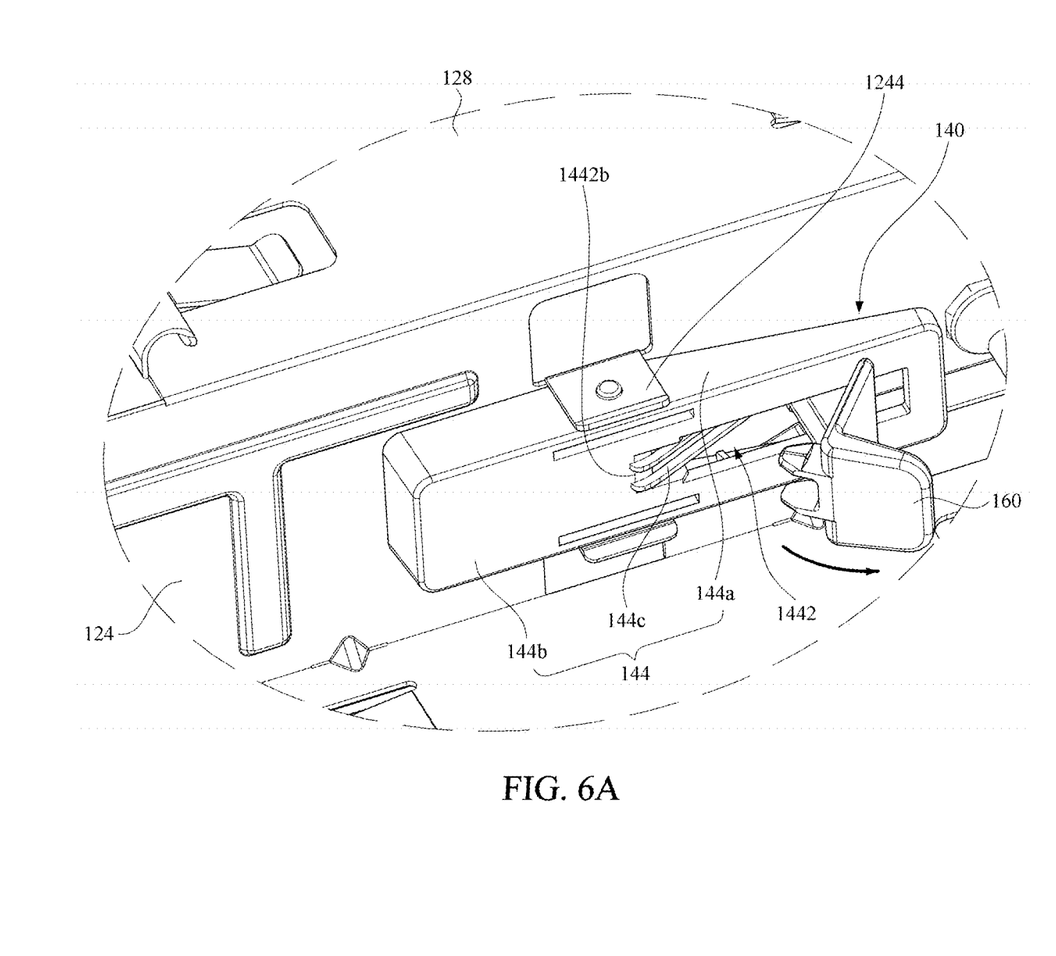
FIG. 6A to FIG. 6C show an embodiment of a disassembling process of an electronic module using the fixing mechanism of FIG. 1A.
Figure 6B:
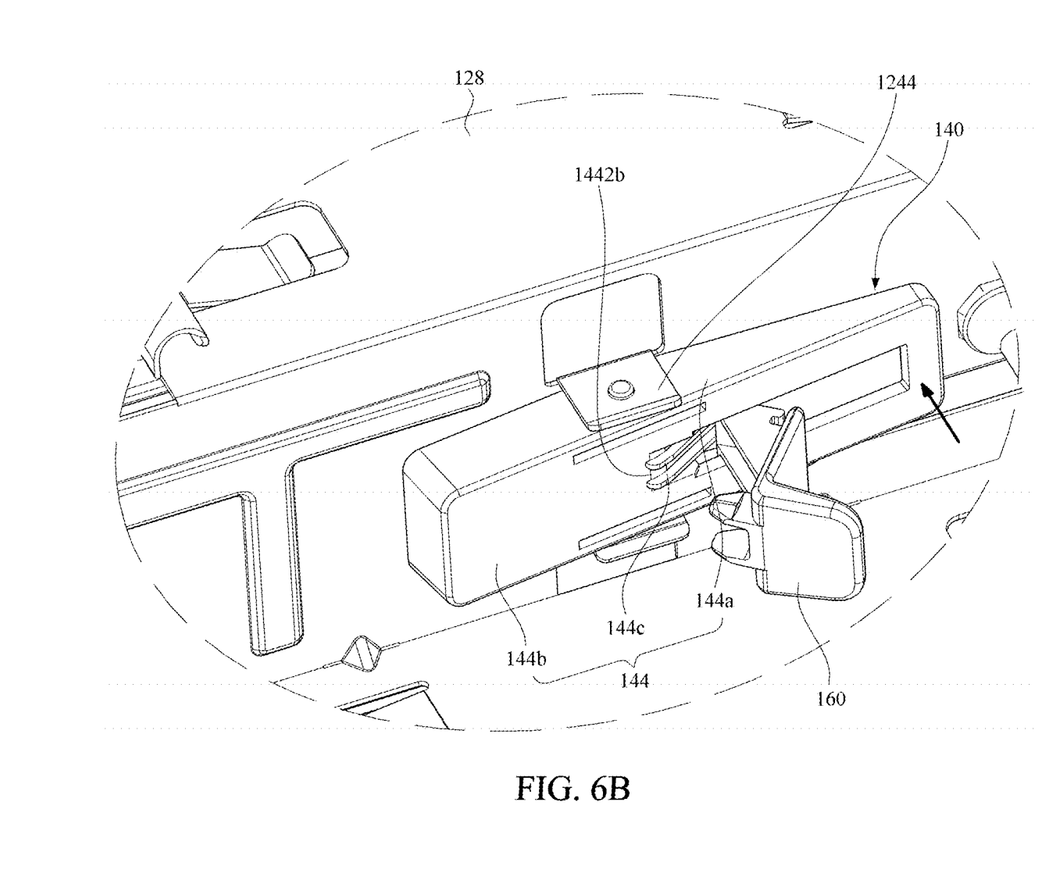
Figure 6C:
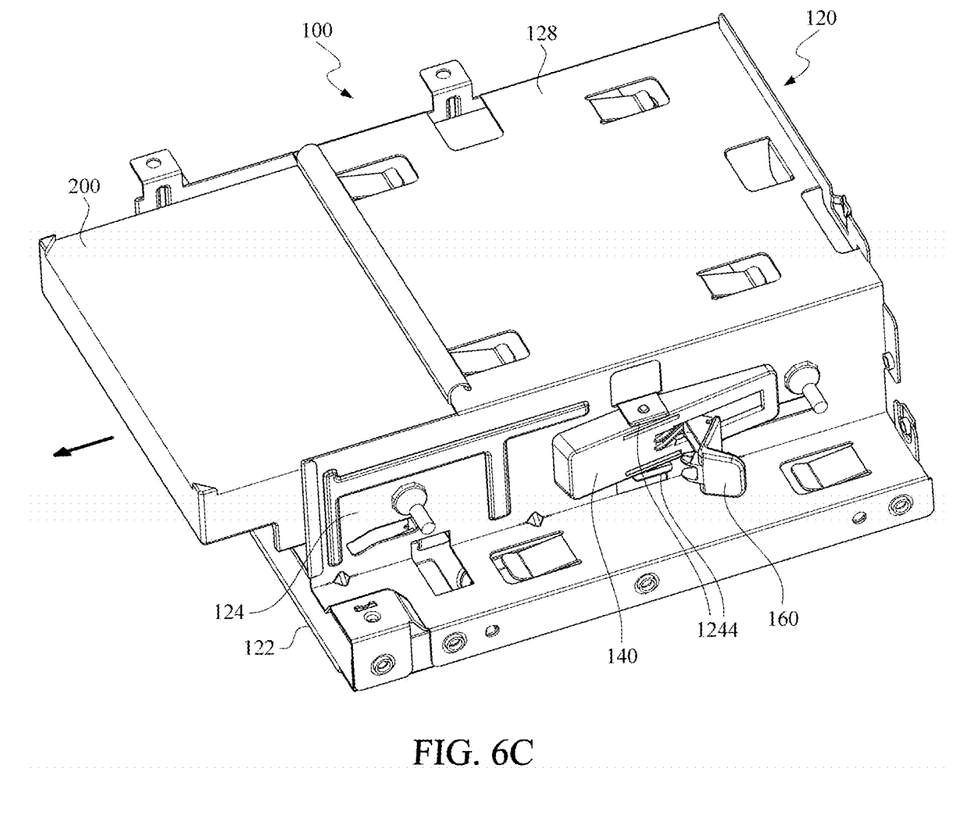

FIG. 6A to FIG. 6C show an embodiment of a disassembling process of the electronic module using the fixing mechanism 100 of FIG. 1A.

To undertake the locking state shown in FIG. 5C, please refer to FIG. 6A. First, the user pulls the locking structure 160 outward (indicated by the arrow shown in the figure), so that the engaging element 162 and the locking element 164 of the locking structure are separated from the opening 1442 of the pressing portion 144. In this way, the pressing portion 144 is restored to a state that can be pressed.

Next, please refer to FIG. 6B. The user presses the first part 144a of the pressing portion 144 (indicated by the arrow shown in the figure) to make the fixing element 142 exit the space A1 and moves toward the outer side of the side plate 124 to release the electronic module 200.

Subsequently, please refer to FIG. 6C, while the fixing element 142 maintains at the exit state, the user pulls out the electronic module 200 from the installing port 129 (indicated by the arrow shown in the figure) to complete the disassembling process of the electronic module.

Compared with the method of fixing the electronic module with screws, the fixing mechanism 100 provided herein facilitates the user to quickly disassemble and assemble the electronic module 200 without tools. In addition, compared to the fixing method that uses trays with card slots, the fixing mechanism 100 provided in the disclosure reduces the size of the parts as well as the manufacturing cost, while firmly fixing the electronic module 200 to prevent damage to the electronic module 200 caused by external impact.

Although the disclosure has been described with reference to the above embodiments, the embodiments are not intended to limit the disclosure. A person of ordinary skill in the art may make variations and improvements without departing from the spirit and scope of the disclosure. Therefore, the protection scope of the disclosure should be subject to the appended claims.

What is claimed is:

1. A fixing mechanism, applied to an electronic device to fix an electronic module, the fixing mechanism comprising:
    a casing, including a baseplate and a side plate that define a space to accommodate the electronic module, and the side plate having a hole and a seat;
    a fixing structure, including:
        a fixing element, movably extending from an outer side of the side plate into the space through the hole; and
        a pressing portion, rotatably disposed on the seat, and including a first part and a second part, wherein the first part includes an opening, and the second part corresponds to the fixing element; and
    a locking structure, movably set in the opening, and including an engaging element, wherein when the engaging element is engaged in the opening, the locking structure passes through the opening and presses against the side plate to fix the pressing portion,
    wherein, the pressing portion further comprises an elastic plate disposed between the first part and the second part.

2. The fixing mechanism according to claim 1, wherein, the locking structure further comprises a locking element, for locking the locking structure to a first edge of the opening.

3. The fixing mechanism according to claim 2, wherein, the locking element has a gap, and the first part includes a protrusion, the protrusion is located at the first edge of the opening for engaging the gap.

4. The fixing mechanism according to claim 1, wherein, the elastic plate extends from a second edge of the opening to the side plate.

5. The fixing mechanism according to claim 1, wherein, the first part, the second part and the elastic plate are integrally formed.

6. The fixing mechanism according to claim 1, wherein, the locking structure comprises a propping element, when the engaging element is engaged in the opening, the propping element presses against the side plate to fix the pressing portion.

7. The fixing mechanism according to claim 6, wherein, the width of the propping element is greater than the width of the opening, to prevent the locking structure from detaching from the opening.

8. The fixing mechanism according to claim 6, wherein, the propping element is in a shape of a wing.

9. The fixing mechanism according to claim 1, wherein, the fixing element is cylindrical shaped.

* * * * *